(12) United States Patent
Mayer et al.

(10) Patent No.: US 12,300,521 B2
(45) Date of Patent: May 13, 2025

(54) METHOD FOR PROTECTING AN OPTOELECTRONIC DEVICE AGAINST ELECTROSTATIC DISCHARGES

(71) Applicant: Aledia, Echirolles (FR)

(72) Inventors: Frédéric Mayer, Voiron (FR); Frédéric Mercier, Saint Nicolas de Macherin (FR); Ivan-Christophe Robin, Grenoble (FR); Xavier Hugon, Teche (FR)

(73) Assignee: Aledia, Echirolles (FR)

( * ) Notice: Subject to any disclaimer, the term of this patent is extended or adjusted under 35 U.S.C. 154(b) by 426 days.

(21) Appl. No.: 17/774,467

(22) PCT Filed: Oct. 12, 2020

(86) PCT No.: PCT/EP2020/078618
§ 371 (c)(1),
(2) Date: May 4, 2022

(87) PCT Pub. No.: WO2021/089277
PCT Pub. Date: May 14, 2021

(65) Prior Publication Data
US 2022/0406628 A1    Dec. 22, 2022

(30) Foreign Application Priority Data

Nov. 8, 2019 (FR) .................................... 1912567

(51) Int. Cl.
*H01L 21/67* (2006.01)
*H01L 21/683* (2006.01)
(Continued)

(52) U.S. Cl.
CPC .... *H01L 21/67144* (2013.01); *H01L 21/6835* (2013.01); *H01L 25/18* (2013.01);
(Continued)

(58) Field of Classification Search
CPC ........... H01L 21/67144; H01L 21/6835; H01L 25/18; H01L 27/14634; H01L 27/1469;
(Continued)

(56) References Cited

U.S. PATENT DOCUMENTS 9,773,750 B2 * 9/2017 Bibl ........................ H01L 24/75
10,297,722 B2 * 5/2019 Chang ...................... H04N 5/64
(Continued)

FOREIGN PATENT DOCUMENTS

| JP | 2019-029465 A | 2/2019 |
| WO | WO 02/063678 A1 | 8/2002 |
| WO | WO 2018/077961 A1 | 5/2018 |

OTHER PUBLICATIONS

International Search Report and Written Opinion for International Application No. PCT/EP2020/078618, mailed Dec. 22, 2020.

*Primary Examiner* — Vu A Vu
(74) *Attorney, Agent, or Firm* — Wolf, Greenfield & Sacks, P.C.

(57) ABSTRACT

A method of protecting optoelectronic devices against electrostatic discharges, each optoelectronic device comprising an optoelectronic circuit comprising at least one optoelectronic component from among a light-emitting diode or a photodiode. The method comprises forming a first wafer, comprising a plurality of copies of the optoelectronic circuit, bonding the first wafer to a support, separating the optoelectronic devices from one another, and removing from the support a plurality of optoelectronic devices from among said optoelectronic devices by means of a gripping system, wherein the gripping system comprises at least one system for protecting optoelectronic devices against electrostatic discharges.

12 Claims, 4 Drawing Sheets

(51) Int. Cl.
  *H01L 25/18*  (2023.01)
  *H01L 27/146* (2006.01)
  *H01L 23/00*  (2006.01)

(52) U.S. Cl.
  CPC .... *H01L 27/14634* (2013.01); *H01L 27/1469* (2013.01); *H01L 24/05* (2013.01); *H01L 24/06* (2013.01); *H01L 24/08* (2013.01); *H01L 2221/68327* (2013.01); *H01L 2224/0557* (2013.01); *H01L 2224/06181* (2013.01); *H01L 2224/08145* (2013.01)

(58) Field of Classification Search
  CPC ......... H01L 24/05; H01L 24/06; H01L 24/08; H01L 2221/68327; H01L 2224/0557; H01L 2224/06181; H01L 2224/08145; H01L 25/0753; H01L 33/0093
  USPC ........................................... 438/464
  See application file for complete search history.

(56) References Cited

U.S. PATENT DOCUMENTS

| | | | | |
|---|---|---|---|---|
| 10,546,796 | B2* | 1/2020 | Hu ................. | H01L 25/167 |
| 10,878,733 | B2* | 12/2020 | Hughes ............ | H01L 25/075 |
| 10,950,485 | B2* | 3/2021 | Hung .............. | H01L 21/67742 |
| 11,114,411 | B2* | 9/2021 | Schwarz ........... | H01L 24/29 |
| 2017/0294415 | A1 | 10/2017 | Or-Bach | |
| 2017/0345692 | A1 | 11/2017 | Liu et al. | |
| 2018/0068995 | A1* | 3/2018 | Kajiyama ......... | H01L 21/6835 |
| 2020/0023479 | A1* | 1/2020 | Lin ............... | H01L 21/68 |
| 2021/0091052 | A1* | 3/2021 | Schuele ........... | H01L 24/92 |

* cited by examiner

METHOD FOR PROTECTING AN OPTOELECTRONIC DEVICE AGAINST ELECTROSTATIC DISCHARGES

This patent application is a national stage filing under 35 U.S.C. § 371 of International Patent Application Serial No. PCT/EP2020/078618, filed Oct. 12, 2020, which claims priority to French patent application FR19/12567, filed Nov. 8, 2019. The contents of these applications are incorporated herein by reference in its entirety.

TECHNICAL BACKGROUND

The present disclosure generally concerns systems and methods for protecting optoelectronic devices against electrostatic discharges.

PRIOR ART

The term optoelectronic devices is used to designate devices capable of converting an electric signal into an electromagnetic radiation or conversely, and particularly devices dedicated to the detection, the measurement, or the emission of an electromagnetic radiation. An example of application concerns a display screen comprising a support having distinct optoelectronic devices bonded thereto, each optoelectronic device comprising at least one light-emitting diode and corresponds to a display pixel. Another example of application concerns an image sensor comprising a support having optoelectronic devices individually bonded thereto, each optoelectronic device comprising at least one photodiode for the capture of signals relative to an image pixel.

It is known to include, in an electronic device, a system for protecting the electronic device against electrostatic discharges (ESDs), particularly electrostatic discharges likely to occur during the electronic device manufacturing and manipulation method.

However, for certain applications, it may not be possible to provide such a protection system in an optoelectronic device, particularly in the case where the optoelectronic device corresponds to a display pixel or to an image sensor pixel, to limit the dimensions of the optoelectronic device.

SUMMARY

Thus, an object of an embodiment is to at least partly overcome the disadvantages of the previously-described systems and methods for protecting optoelectronic devices against ESDs.

Another object of an embodiment is to protect the optoelectronic device against ESDs during the manipulation of the optoelectronic device.

Another object of an embodiment is for optoelectronic devices to be capable of being formed at an industrial scale and at a low cost.

An embodiment provides a method of protecting optoelectronic devices against electrostatic discharges, each optoelectronic device comprising an optoelectronic circuit comprising at least one optoelectronic component from among a light-emitting diode or a photodiode, the method comprising forming a first wafer, comprising a plurality of copies of the optoelectronic circuit, bonding the first wafer to a support, separating the optoelectronic devices from one another, and removing from the support a plurality of optoelectronic devices among said optoelectronic devices by means of a gripping system, wherein the gripping system comprises at least one system for protecting optoelectronic devices against electrostatic discharges.

According to an embodiment, the gripping system comprises a gripper comprising housings adapted to receiving the optoelectronic devices, and before the step of removal of said plurality of optoelectronic devices from the support by the gripper, one of the optoelectronic devices, called sacrificial device, is placed into contact with the gripper before said plurality of optoelectronic devices comes into contact with the gripper.

According to an embodiment, the gripping system comprises an element protruding from the gripper coming into contact with the sacrificial device while the gripper and the support are relatively brought towards each other before said plurality of optoelectronic devices comes into contact with the gripper.

According to an embodiment, the protection system comprises a wafer coupled to the gripper by an elastic link.

According to an embodiment, the elastic link is electrically conductive.

According to an embodiment, the method comprises the local deformation of the support to bring said sacrificial device towards the gripper with respect to said plurality of optoelectronic devices.

According to an embodiment, the protection system comprises an actuator adapted to locally deforming the support.

According to an embodiment, the first wafer is bonded to the support via conductive glue.

According to an embodiment, each optoelectronic device comprises an electronic circuit comprising at least one electronic component, the optoelectronic circuit being bonded to the electronic circuit.

An embodiment also provides a gripping system for the implementation of the method such as previously defined, comprising the system for protecting optoelectronic devices against electrostatic discharges.

According to an embodiment, the protection system comprises a wafer coupled to the gripper by an elastic link.

According to an embodiment, the protection system comprises an actuator adapted to locally deforming the support.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DESCRIPTION OF THE EMBODIMENTS

Like features have been designated by like references in the various figures. In particular, the structural and/or functional features that are common among the various embodiments may have the same references and may dispose identical structural, dimensional and material properties. For the sake of clarity, only the steps and elements that are useful for an understanding of the embodiments described herein have been illustrated and described in detail.

In the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings or to an optoelectronic device in a normal position of use. Unless specified otherwise, the expressions "around", "approximately", "substantially" and "in the order of" signify within 10%, and preferably within 5%. Further, it is here considered that the terms "insulating" and "conductive" respectively signify "electrically insulating" and "electrically conductive".

Embodiments of ESD protection systems and methods will be described for optoelectronic devices corresponding to display pixels. However, it should be clear that these embodiments may be implemented for other types of optoelectronic devices, for example, image pixel sensors.

Figure 1:
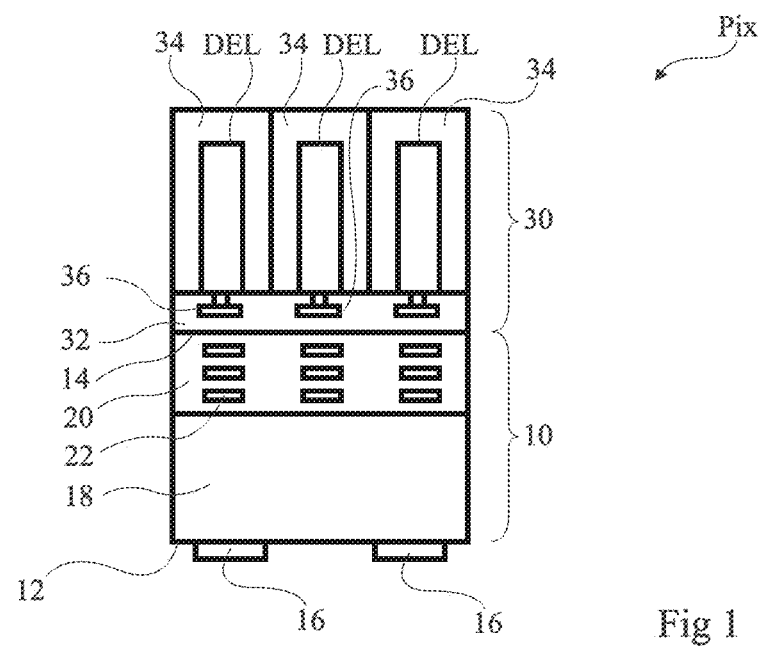
FIG. 1 is a partial simplified cross-section view of an example of an optoelectronic device comprising light-emitting diodes.

FIG. 1 is a partial simplified cross-section view of an embodiment of a display pixel Pix. Display pixel Pix comprises from bottom to top in FIG. 1:

an electronic circuit 10, called control circuit hereafter; and an optoelectronic circuit 30.

Control circuit 10 comprises a lower surface 12 and an upper surface 14 opposite to lower surface 12, surfaces 12 and 14 being preferably parallel. Control circuit 10 further comprises conductive pads 16 on lower surface 12. Control circuit 10 may comprise a semiconductor substrate 18, a stack 20 of insulating layers covering substrate 18, and conductive tracks 22 of several metallization levels formed between the insulating layers of stack 20 and connected by conductive vias, not shown. Control circuit 10 may further comprise electronic components, not shown in FIG. 1, particularly transistors, formed inside and/or on top of substrate 18. An insulating layer, not shown, may cover semiconductor substrate 18 on the side opposite to stack 20 and delimit the lower surface 12 of control circuit 10. Control circuit 10 may further comprise through conductive vias, not shown, extending in substrate 18, across the entire thickness of substrate 18 to couple pads 16 to the front surface of substrate 18. Semiconductor substrate 18 is, for example, a silicon substrate, particularly made of single-crystal silicon. The electronic components may then comprise insulated gate field-effect transistors, also called MOS transistors. According to another embodiment, substrate 18 may correspond to a non-semiconductor substrate. The electronic components may then comprise thin-film transistors, also called TFTs, formed on substrate 18.

Optoelectronic circuit 30 is bonded to the upper surface 14 of control circuit 10. It comprises a support 32 having light-emitting diodes DEL, preferably at least three light-emitting diodes, formed thereon. Optoelectronic circuit 30 may comprise photoluminescent blocks 34 covering light-emitting diodes DEL on the side opposite to control circuit 10. Each photoluminescent block 34 is opposite at least one of light-emitting diodes DEL.

Optoelectronic circuit 30 comprises conductive elements 36 located in support 32, and connected to the electrodes of light-emitting diodes DEL. Optoelectronic circuit 30 is electrically coupled to control circuit 10 by conductive pads, which may correspond to conductive elements 36 and which are in contact with conductive pads of control circuit 10.

Preferably, optoelectronic circuit 30 only comprises light-emitting diodes DEL and the conductive elements 36 of these light-emitting diodes DEL, and control circuit 10 comprises all the electronic components necessary to control the light-emitting diodes DEL of optoelectronic circuit 30. As a variant, optoelectronic circuit 30 may also comprise other electronic components in addition to light-emitting diodes DEL.

Figure 2:
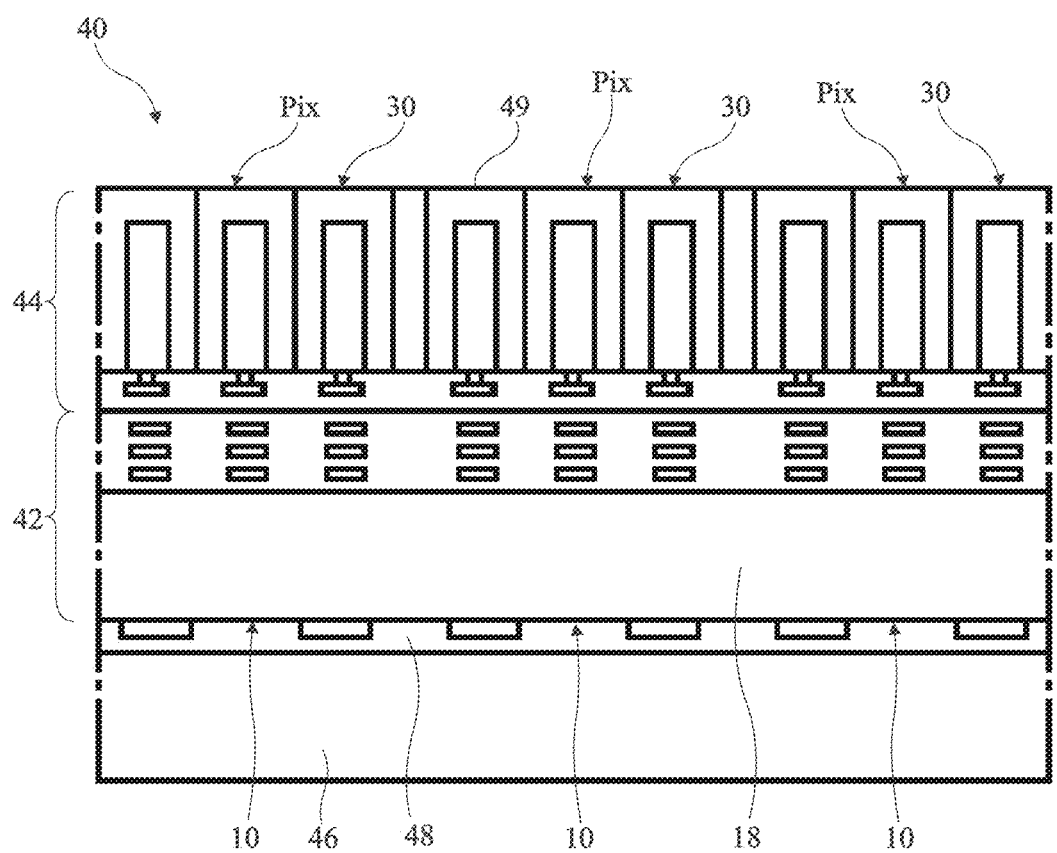
FIG. 2 is a cross-section view of the structure obtained at a step of an example of a method of manufacturing the optoelectronic device of FIG. 1.
Figure 3:
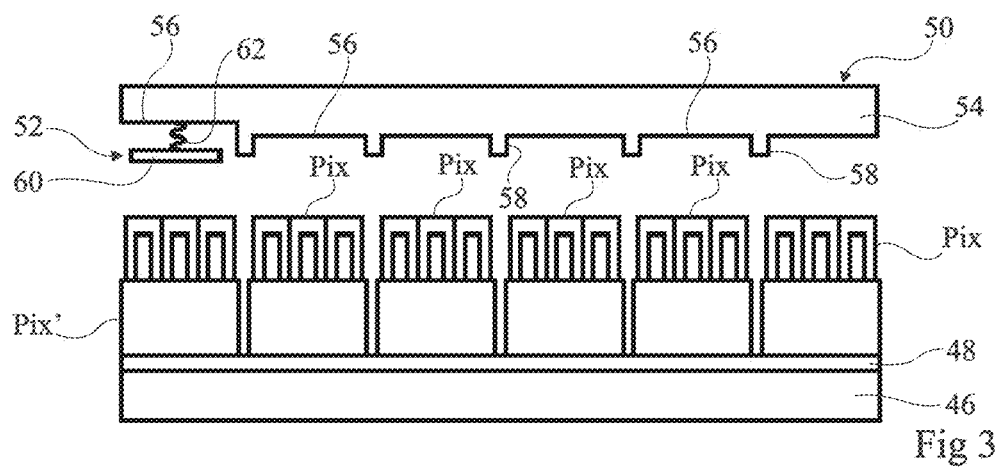
FIG. 3 is a cross-section view of the structure obtained at a step of an embodiment of a method of placing optoelectronic devices implementing an ESD protection.
Figure 4:
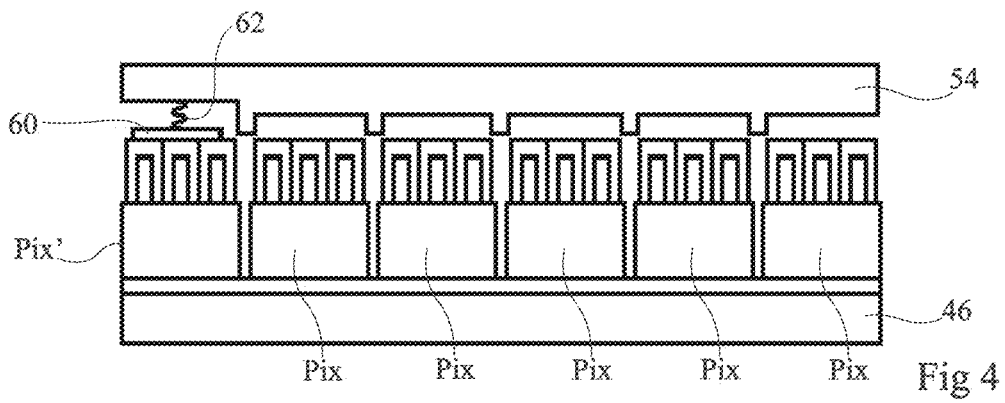
FIG. 4 is a cross-section view of the structure obtained at another step of the method.
Figure 5:
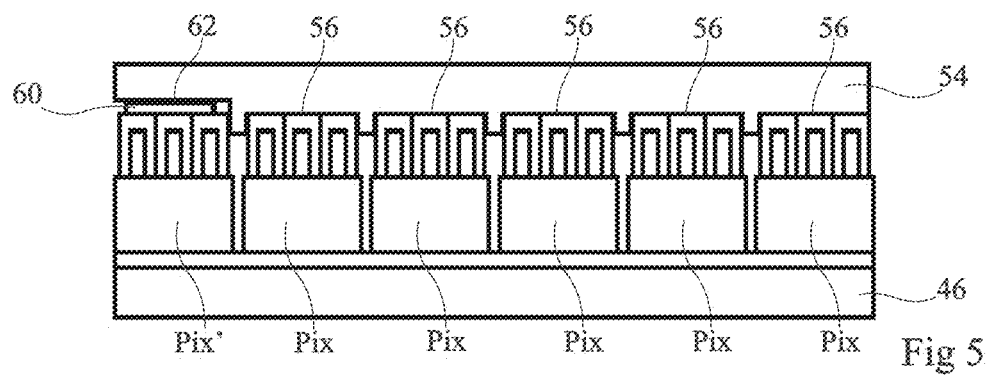
FIG. 5 is a cross-section view of the structure obtained at another step of the method.
Figure 6:
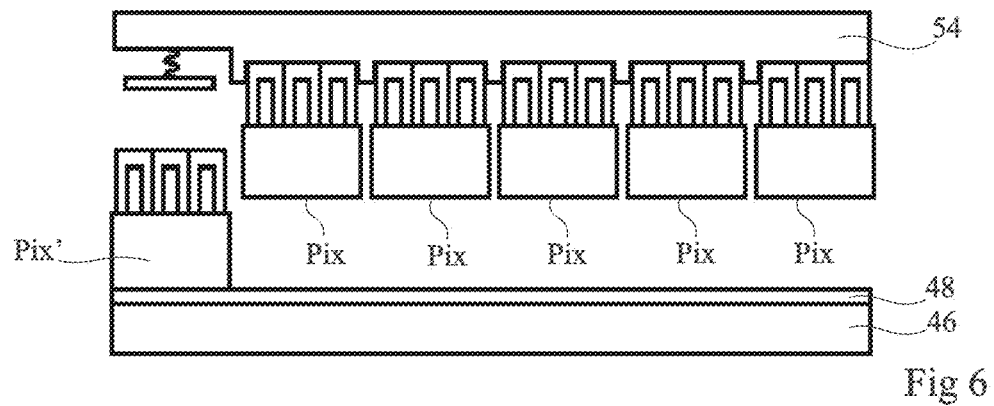
FIG. 6 is a cross-section view of the structure obtained at another step of the method.
Figure 7:
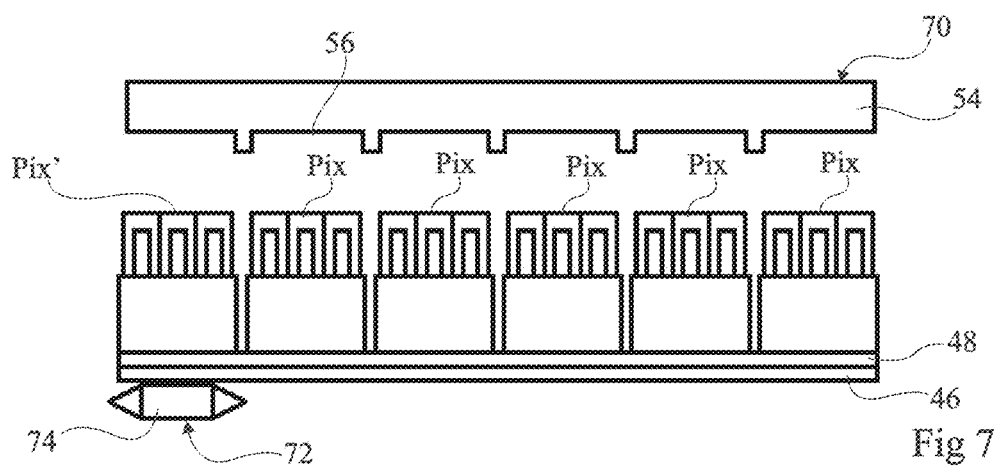
FIG. 7 is a cross-section view of the structure obtained at a step of another embodiment of a method of placing optoelectronic devices implementing an ESD protection.
Figure 8:
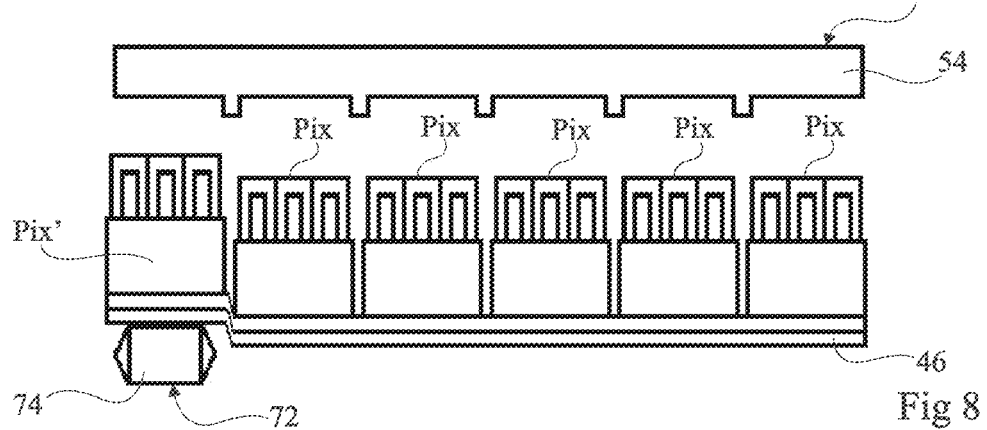
FIG. 8 is a cross-section view of the structure obtained at another step of the method.
Figure 9:
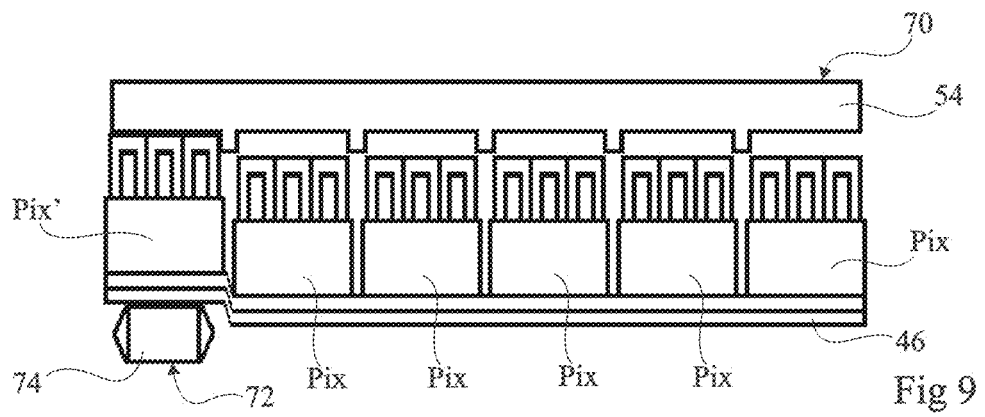
FIG. 9 is a cross-section view of the structure obtained at another step of the method.
Figure 10:
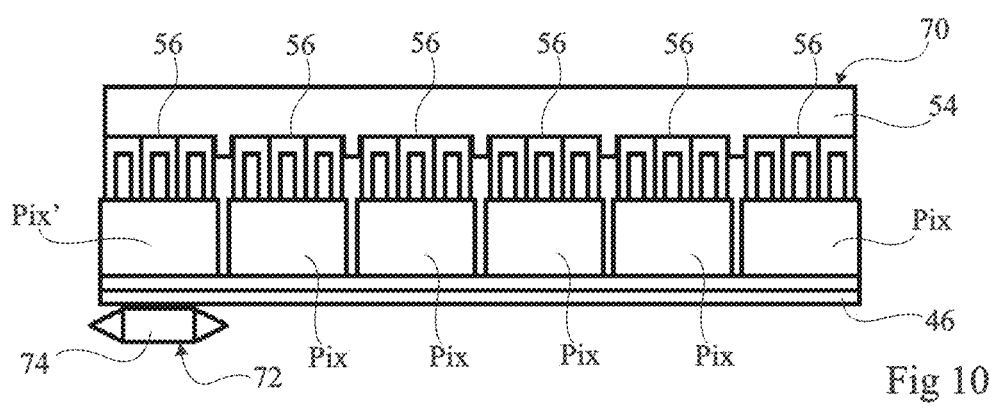
FIG. 10 is a cross-section view of the structure obtained at another step of the method.

FIG. 2 is a cross-section view of a structure 40 obtained at a step of an example of a method of manufacturing the display pixel Pix of FIG. 1. Structure 40 comprises an integrated circuit wafer 42 comprising a plurality of copies of control circuit 10 and a wafer 44 comprising a plurality of copies of optoelectronic circuit 30, three copies of control circuit 10 and of optoelectronic circuit 30 being shown. Each wafer 42, 44 may be manufactured separately. In particular, the wafer 42 comprising control circuits 10 may be manufactured by implementing CMOS transistor manufacturing techniques. The wafer 44 comprising optoelectronic circuits 30 may then be bonded to the wafer 42 comprising control circuits 10, for example, by hybrid molecular bonding. The manufacturing method may comprise the temporary bonding of wafer 42 to a support 46, also called handle, by means of a glue layer 48. According to an embodiment, glue layer 48 is electrically conductive. The use of handle 46 may particularly be provided after a step of bonding of wafer 42 to wafer 44 followed by a step of thinning of substrate 18. A cutting step may then be implemented to individualize display pixels Pix. The cutting is performed on the side of the upper surface 49 of structure 40, which is the surface of wafer 44 most distant from handle 46. Display pixels Pix may then be removed form support 46 and bonded to another support, for example, a printed circuit, to obtain a display screen.

A display screen may comprise from 10 to $10^9$ display pixels Pix. Each display pixel Pix may occupy in top view a surface area in the range from 1 μm² to 100 mm². The thickness of each display pixel Pix may be in the range from 1 μm to 6 mm.

Electrostatic discharges may occur during the manipulation of display pixels Pix once individualized.

According to an embodiment, a system for protecting display pixels Pix against ESDs is provided, after the separation of display pixels Pix, during the manipulation of the display pixels. The manipulation of the display pixels may be performed by means of a gripper that may simultaneously grip a plurality of display pixels to deposit them on a support, for example, a printed circuit of a display screen. An ESD may occur when the gripper comes into contact with the display pixels. According to an embodiment, the protection system comprises means for, before the gripper comes into contact with the display pixels, place into contact a sacrificial display pixel with the gripper. Thereby, if an ESD occurs, it will be through the sacrificial display pixel. This sacrificial display pixel may then be systematically discarded whether an ESD has occurred or not.

FIGS. 3 to 6 are partial simplified cross-section views of an embodiment of a system for gripping 50 display pixels Pix, comprising an ESD protection system 52, at successive steps of a transport of display pixels Pix.

Gripping system 50 comprises a gripper 54 comprising housings 56, each housing 56 being capable of receiving a display pixel Pix. Gripper 54 comprises means, not shown, for holding display pixel Pix in the corresponding housing 56 when gripper 54 is placed in contact or close to housing 56. The holding means may comprise suction pads, for example, vacuum pads. In FIGS. 3 to 6, each housing 56 has been shown as delimited by an edge 58. However, edges 58 may not be present. Protection system 52 is arranged in one of housings 56 and comprises a plate 60 coupled by an elastic link 62 to housing 56. In the housing 56 where protection system 52 is provided, there may be no holding means. Gripping system 50, particularly plate 60, elastic link 62, and gripper 54 are at least partly made of a conductive material to allow the circulation of electric charges.

According to an embodiment, the transport of display pixels Pix comprises the steps of:
placing gripper 54 opposite the display pixels Pix still bonded to handle 46 after the step of separation of display pixels Pix (FIG. 3), each display pixel Pix being located opposite one of housings 56, the display pixel arranged opposite the housing 56 where protection system 52 is provided corresponds to the previously-described sacrificial pixel Pix';
bringing gripper 54 and handle 46 towards each other (FIG. 4) until plate 60 comes into contact with sacrificial pixel Pix', while the other display pixels Pix are then not in contact with gripper 54. An ESD can then occur through sacrificial pixel Pix'. The use of conductive glue layer 48 advantageously enables to create a path for removing electric charges from gripper 54 to handle 46 through sacrificial pixel Pix';
keeping on bringing gripper 54 and handle 46 towards each other (FIG. 5) until each display pixel Pix is located in the corresponding housing and actuating the holding means, elastic link 62 deforming to allow the displacement of plate 60 and of sacrificial pixel Pix'; and
releasing display pixels Pix from handle 46 (FIG. 6), for example, by local laser deterioration of glue layer 48 or by tearing, the suction force of gripping system 50 on display pixels Pix being greater than the holding force of glue layer 48, possibly except for sacrificial pixel Pix', and drawing gripper 54 away from handle 46, display pixels Pix remaining bonded to gripper 54 due to the holding means.

Subsequent steps of the method may comprise displacing gripper 54, provided with display pixels Pix, all the way to a support, and depositing display pixels Pix on the support.

FIGS. 7 to 10 are partial simplified cross-section views of another embodiment of a system 70 for gripping display pixels Pix, comprising an ESD protection system 72, at successive steps of a transport of display pixels Pix.

Gripping system 70 comprises all the elements of the gripping system 50 shown in FIGS. 3 to 6, except for protection system 52 which is replaced with protection system 72 which comprises a deformable element 74 arranged on the side of handle 46 opposite to sacrificial pixel Pix' and adapted to locally deforming handle 46 when it is actuated. In the present embodiment, handle 46 may be locally deformed. According to an embodiment, handle 46 may correspond to a film, for example, made of polyethylene terephthalate (PET) or of polypropylene, covered with an adhesive, for example, acrylic glue. According to another embodiment, the handle may correspond to a thinned silicon substrate. Handle 46 for example has a thickness in the range from 50 µm to 300 µm. Protection system 72 may comprise a piezoelectric actuator.

According to an embodiment, the transport of display pixels Pix comprises the steps of:
placing gripper 54 opposite the display pixels Pix still bonded to handle 46 after the step of separation of display pixels Pix (FIG. 7), each display pixel Pix being located opposite one of housings 56, while deformable element 74 is not actuated so that handle 46 is not locally deformed by deformable element 74;
actuating protection system 72 so that deformable element 74 bears against handle 46 to obtain a local deformation of handle 46 (FIG. 8), which causes a relative motion towards each other only of sacrificial pixel Pix' and of gripper 54 while the relative position between each of the other display pixels Pix and gripper 54 is not modified. The displacement of sacrificial pixel Pix' between the non-deformed state of deformable element 74 and the deformed state of deformable element 74 may be in the range from 1 µm to 1 mm;
bringing gripper 54 and handle 46 towards each other (FIG. 9) until gripper 54 comes into contact with sacrificial pixel Pix', while the other display pixels Pix are then not in contact with gripper 54. An ESD may then occur through sacrificial pixel Pix'; and
keeping on bringing gripper 54 and handle 46 towards each other until each display pixel Pix is located in the corresponding housing 56 (FIG. 10) while deformable element 72 is deactivated so that handle 46 returns to a position of equilibrium and actuating the holding means.

The method carries on with the releasing of display pixels Pix from handle 46, for example, by local laser deterioration of glue layer 48 or by tearing, the suction force of gripping system 50 on display pixels Pix being greater than the holding force of glue layer 48, possibly except for sacrificial pixel Pix', and drawing gripper 54 away from handle 46, display pixels Pix remaining bonded to gripper 54 due to the holding means. Subsequent steps of the method may comprise displacing gripper 54, provided with display pixels Pix, all the way to a support, and depositing display pixels Pix on the support.

An advantage of the embodiments of the transport methods previously described in relation with FIGS. 3 to 6 and 7 to 10 is that they allow the simultaneous transport and placing of a plurality of display pixels.

Figure 11:
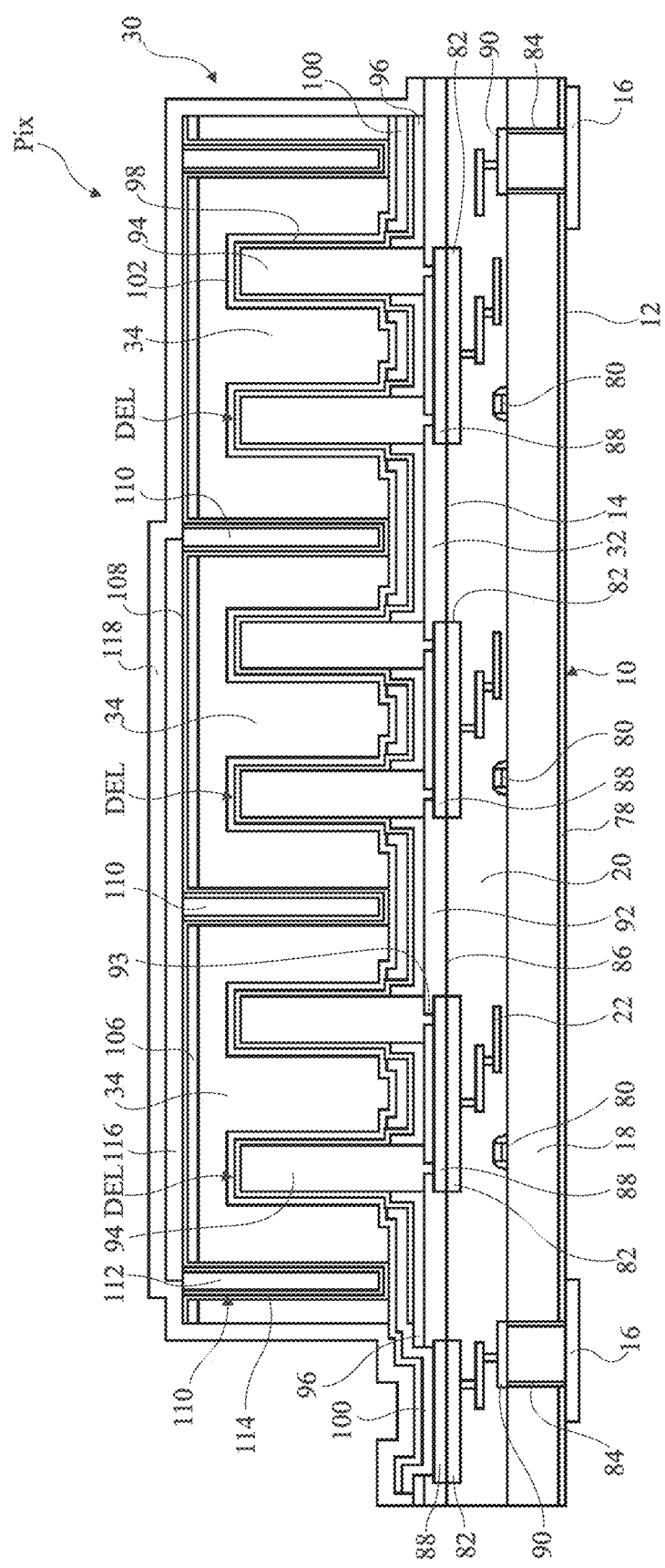
FIG. 11 is a partial simplified cross-section view of a more detailed embodiment of the structure of a display pixel.

FIG. 11 is a partial simplified cross-section view of a more detailed embodiment of display pixel Pix.

According to an embodiment, the control circuit 10 of display pixel Pix comprises from bottom to top in FIG. 11:
semiconductor substrate 18, for example, single-crystal silicon, an insulating layer 78 on the side of lower surface 12, and the two conductive pads 16;
MOS transistors 80, formed inside and on top of substrate 18;
stack 20 of insulating layers, for example, made of silicon oxide and/or of silicon nitride, covering substrate 18 and the conductive tracks 22 of a plurality of metallization levels formed between the insulating layers of the stack, having in particular pads 82 exposed on the upper surface 14 of electronic circuit 10, where the conductive tracks 22 of the first metallization level may be made of polysilicon and particularly form the gates of MOS transistors 80 and where the conductive tracks 22 of the other metallization levels may be metal tracks, for example, made of aluminum, of silver, of copper, or of zinc; and conductive and laterally insulated vias 84, also called TSVs (Through Silicon Vias) crossing substrate 18 and coupling pads 16 to pads 90 of the first metallization level of stack 20.

According to an embodiment, the optoelectronic circuit 30 of display pixel Pix comprises from bottom to top in FIG. 11:

support 32 comprising a lower surface 86 in contact with upper surface 14 and comprising conductive pads 88 exposed on lower surface 86, in contact with pads 82, and a multilayer insulating structure 92, for example, made of silicon oxide or of silicon nitride, extending between pads 88 and covering pads 88 and comprising openings 93 exposing portions of pads 88;

microwires or nanowires 94, called wires hereafter (six wires being shown), each wire 94 being in contact with one of pads 88 through one of opening 93;

an insulating layer 96 extending on the lateral sides of a lower portion of each wire 94 and extending on insulating layer 92 between wires 94;

a shell 98 comprising a stack of semiconductor layers covering an upper portion of each wire 94 and extending on insulating layer 96 between wires 94, shell 98 particularly comprising an active layer which is the layer having most of the radiation supplied by the light-emitting diode emitted therefrom and comprising, for example, confinement means, such as multiple quantum wells;

a conductive and reflective layer 100 extending on shell 98 between wires 94;

a layer 102 forming an electrode covering, for each wire 94, shell 98 and further extending on conductive layer 100 between wires 94, electrode layer 102 being adapted to giving way to the electromagnetic radiation emitted by the light-emitting diodes and being formed of a transparent and conductive material such as indium-tin oxide (or ITO), aluminum- or gallium-doped zinc oxide, or graphene;

photoluminescent blocks 34 covering certain assemblies of light-emitting diodes DEL or blocks transparent to the radiation emitted by the light-emitting diodes, each photoluminescent block comprising luminophores adapted, when they are excited by the light emitted by the associated light-emitting diodes DEL, to emitting light at a wavelength different from the wavelength of the light emitted by the associated light-emitting diodes DEL;

an insulating layer 106 covering the upper surface of each block 34, which insulating layer 106 may not be present;

a protection layer 108 covering insulating layers 106, the lateral surfaces of blocks 34, and the electrode 102 between blocks 104;

walls 110 between blocks 104, where each wall 110 may comprise a core 112 surrounded with a coating 114 reflecting at the wavelength of the radiation emitted by photoluminescent blocks 34 and/or light-emitting diodes DEL;

a color filter 116 covering at least some of photoluminescent blocks 34; and an encapsulation layer 118 covering the entire structure.

Each wire 94 for example has a mean diameter, for example corresponding to the diameter of the disk having the same area as the cross-section of wire 94, in the range from 5 nm to 5 µm, preferably from 100 nm to 2 µm, more preferably from 200 nm to 1.5 µm, and a height greater than or equal to 1 time, preferably greater than or equal to 3 times, and more preferably still greater than or equal to 5 times the mean diameter, particularly greater than 500 nm, preferably in the range from 1 µm to 50 µm. Wires 94 comprise at least one semiconductor material. The semiconductor material may be silicon, germanium, silicon carbide, a III-V compound, for example, GaN, AlN, InN, InGaN, AlGaN, or AlInGaN, a II-VI compound, or a combination of at least two of these compounds.

According to an embodiment, light-emitting diodes DEL are adapted to emitting blue light, that is, a radiation having a wavelength in the range from 430 nm to 490 nm. According to an embodiment, the first wavelength corresponds to green light and is in the range from 510 nm to 570 nm. According to an embodiment, the second wavelength corresponds to red light and is in the range from 600 nm to 720 nm. According to another embodiment, light-emitting diodes DEL are for example adapted to emitting an ultraviolet radiation. According to an embodiment, the first wavelength corresponds to blue light and is within the range from 430 nm to 490 nm. According to an embodiment, the second wavelength corresponds to green light and is within the range from 510 nm to 570 nm. According to an embodiment, the third wavelength corresponds to red light and is within the range from 600 nm to 720 nm.

Various embodiments and variants have been described. Those skilled in the art will understand that certain features of these various embodiments and variants may be combined, and other variants will occur to those skilled in the art. In particular, even though embodiments have been described in the case of display pixels comprising light-emitting diodes comprising microwires or nanowires, it should be clear that these embodiments may concern a display pixel comprising light-emitting diodes comprising micrometer-range or nanometer-range pyramids, a pyramid being a three-dimensional structure having a portion of elongated pyramidal or conical shape. This pyramidal structure may be truncated, that is, the top of the cone is absent and replaced with a flat area. The base of the pyramid is inscribed within a polygon having a side dimension from 100 nm to 10 µm, preferably from 1 µm to 3 µm. The polygon forming the base of the pyramid may be a hexagon. The height of the pyramid between the base of the pyramid and the apex or the top plateau varies from 100 nm to 20 µm, preferably from 1 µm to 10 µm. Further, although embodiments have been described in the case of display pixels comprising light-emitting diodes comprising microwires or nanowires, it should be clear that these embodiments may concern a display pixel comprising planar light-emitting diodes where each light-emitting diode is formed by a stack of planar semiconductor layers.

The invention claimed is:

1. A method of protecting optoelectronic devices against electrostatic discharges, each optoelectronic device comprising an optoelectronic circuit comprising at least one optoelectronic component from among a light-emitting diode or a photodiode, the method comprising forming a first wafer, comprising a plurality of copies of the optoelectronic circuit, bonding the first wafer to a support, separating the optoelectronic devices from one another, and removing from the support a plurality of optoelectronic devices among said optoelectronic devices by means of a gripping system, wherein the gripping system comprises at least one protection system for protecting optoelectronic devices against electrostatic discharges, wherein before the step of removal of said plurality of optoelectronic devices from the support by the gripping system, one of the optoelectronic devices other than said plurality of optoelectronic devices, called sacrificial device, is placed into contact with the gripping system before said plurality of optoelectronic devices comes into contact with the gripping system.

2. A method according to claim 1, wherein the gripping system comprises a gripper comprising housings adapted to receiving the optoelectronic devices.

3. A method according to claim 2, wherein the gripping system comprises an element protruding from to the gripper coming into contact with the sacrificial device while the gripper and the support are relatively brought towards each other before said plurality of optoelectronic devices comes into contact with the gripper.

4. A method according to claim 3, wherein the protection system comprises a plate coupled to the gripper by an elastic link.

5. A method according to claim 4, wherein the elastic link is electrically conductive.

6. A method according to claim 2, comprising the local deformation of the support to bring said sacrificial device towards the gripper with respect to said plurality of optoelectronic devices.

7. A method according to claim 6, wherein the protection system comprises an actuator adapted to locally deforming the support.

8. A method according to claim 1, wherein the first wafer is bonded to the support via conductive glue.

9. A method according to claim 1, wherein each optoelectronic device comprises an electronic circuit comprising at least one electronic component, the optoelectronic circuit being bonded to the electronic circuit.

10. A gripping system for the implementation of the method according to claim 1, comprising the system for protecting optoelectronic devices against electrostatic discharges.

11. A gripping system according to claim 10, wherein the protection system comprises a plate coupled to the gripper by an elastic link.

12. A gripping system according to claim 10, wherein the protection system comprises an actuator adapted to locally deforming the support.

* * * * *